United States Patent [19]

Fang et al.

[11] Patent Number: 5,757,834
[45] Date of Patent: May 26, 1998

[54] DEVICE FOR SYNCHRONIZING BRANCHES OF A VITERBI DECODER INCLUDED IN A MULTIDIMENSIONAL TRELLIS CODED DIGITAL DATA RECEIVER

[75] Inventors: Juing Fang, Cergy; Mani Kimiavi, Nanterre, both of France

[73] Assignee: Alcatel Telspace, Nanterre Cedex, France

[21] Appl. No.: 530,632

[22] Filed: Sep. 20, 1995

[30] Foreign Application Priority Data

Sep. 27, 1994 [FR] France .................... 94 11516

[51] Int. Cl.$^6$ .................................................. H03M 13/12
[52] U.S. Cl. ................................................................ 371/46
[58] Field of Search ............................................... 371/46

[56] References Cited

U.S. PATENT DOCUMENTS

| | | | |
|---|---|---|---|
| 3,789,359 | 1/1974 | Clark, Jr., et al. | 371/46 |
| 3,806,647 | 4/1974 | Dohne et al. | 375/281 |
| 3,872,432 | 3/1975 | Bismarck | 371/46 |
| 4,918,446 | 4/1990 | Yagi | 341/94 |
| 5,428,646 | 6/1995 | Eyuboglu | 375/354 |

FOREIGN PATENT DOCUMENTS

| | | |
|---|---|---|
| 0208537A3 | 1/1987 | European Pat. Off. . |
| 0233788A2 | 8/1987 | European Pat. Off. . |
| 0425153A2 | 5/1991 | European Pat. Off. . |

OTHER PUBLICATIONS de Mateo, "Node Synchronization Technique for Any 1/n Rate Convolutional Code", IEEE International Communications Conference, Jun. 1991, pp. 1681–1687.

Sodha et al., "Node Synchronization for High Rate Convolutional Codes", Electronics Letters, vol. 28, No. 9, Apr. 23, 1992, pp. 810–812.

Berrou et al., "Pseudo–Syndrome Method for Supervising Viterbi decoders at any Coding Rate", Electronics Letters, vol. 30, No.13, Jun. 23, 1994, pp. 1036–1037.

IEEE International Conference on Communications ICC 1988, Philadelphia, US Jun. 12–15, 1988, vol. 1, 12 Jun. 1988, IEEE, New York, US, pp. 80–84; M.D. Rauchwerk, "A Technique for Multidimensional Symbol and Multiplexing Frame Synchronization in Multidimensional Trellis Coded Modems using Non–Standard Baud".

IEEE Global Telecommunications Conference & Exhibition, San Diego, US, Dec. 2–5, 1990, vol. 1, 2 Dec. 1990, IEEE,NY, US, pp. 604–608, M. Moeneclaey et al, "Syndrome–based Viterbi Decoder Node Synchronization and Out–of–Lock Detection".

Electronics Letters, vol. 30, No. 13, 23 Jun. 1994, London GB, pp. 1036–1037, C. Berrou et al, "Pseudo–syndrome method for supervising Viterbi decoders at any coding rate".

IEEE Transactions on Communications, vol. COM–32, No. 5, May 1984, NY US, pp. 524–531, G. Lorden et al, "Node Synchronization for the Viterbi Decoder".

*Primary Examiner*—Stephen M. Baker
*Attorney, Agent, or Firm*—Sughrue, Mion, Zinn, Macpeak & Seas, PLLC

[57] ABSTRACT

A branch synchronization device for multidimensional trellis coded digital data receivers using convolutional encoders includes a Viterbi decoder receiving two streams of symbols and supplying coded sequences and a time shifter for time shifting the symbol streams fed to the Viterbi decoder. The time shifter is controlled by a branch synchronization decision device generating a time shift control signal. The branch synchronization decision device cooperates with a calculator circuit receiving the coded sequences and supplying to the synchronization decision device an output signal of a first type if the coded sequences correspond to sequences such as would be obtained directly from the convolutional encoder and supplying an output signal of a second type if the coded sequences do not correspond to sequences that could have been obtained from the convolutional encoder. This output signal is fed to the branch synchronization device.

10 Claims, 3 Drawing Sheets

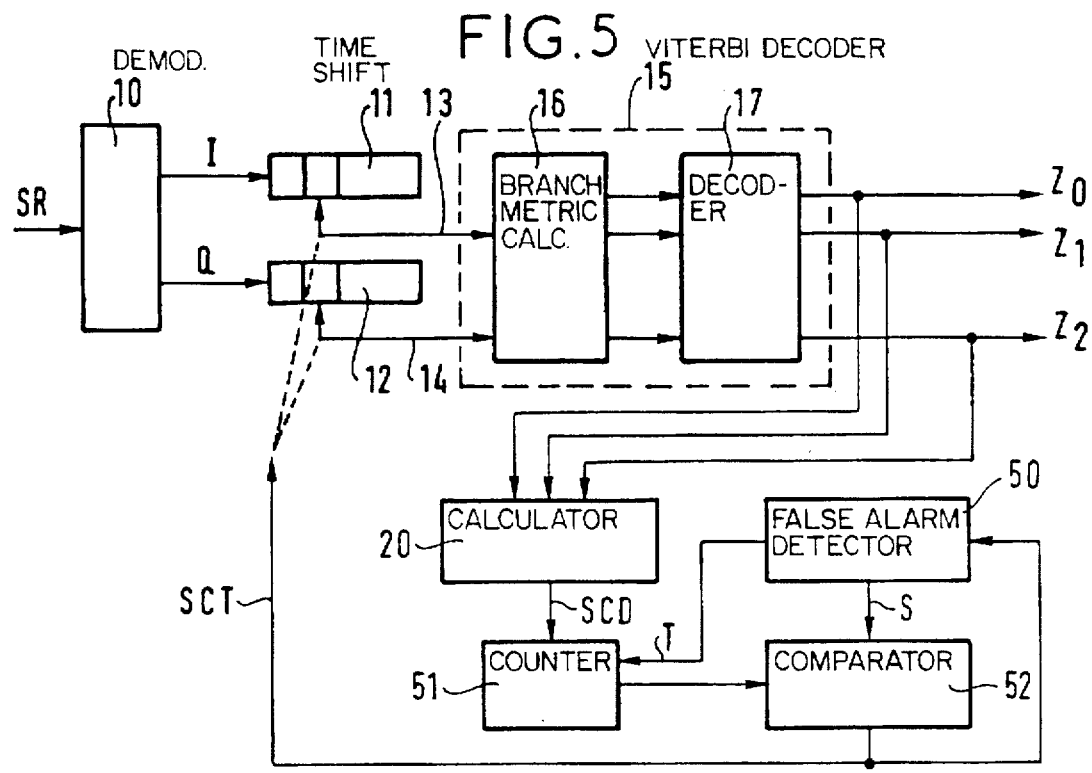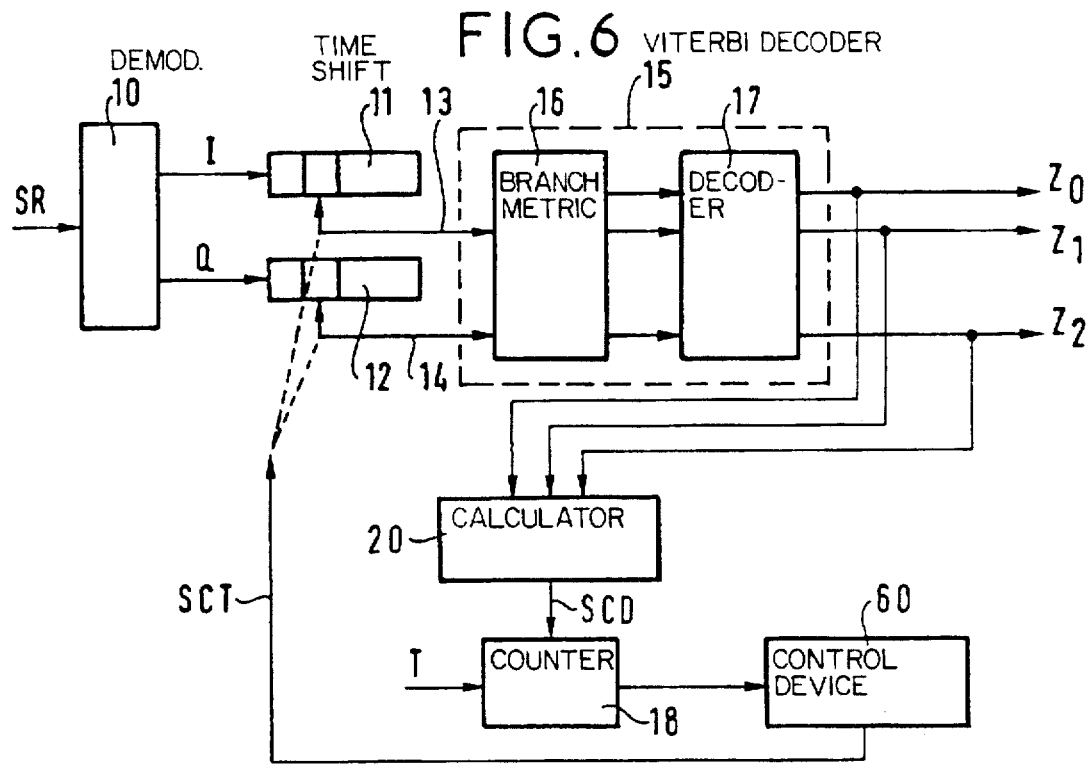

DEVICE FOR SYNCHRONIZING BRANCHES OF A VITERBI DECODER INCLUDED IN A MULTIDIMENSIONAL TRELLIS CODED DIGITAL DATA RECEIVER

BACKGROUND OF THE INVENTION

1. Field of the Invention

The field of the invention is that of digital data receivers and more particularly a multidimensional trellis coded (trellis coded modulation TCM) digital data receiver including a device for synchronizing branches of a Viterbi decoder.

2. Description of the Prior Art

Multidimensional trellis coded modems use cells made up of a plurality of two-dimensional QAM (Quadrature Amplitude Modulation) or M-PSK (Multiple Phase Shift Keying) symbols. On transmission, some of the digital data to be transmitted undergoes linear or non-linear convolutional encoding and the coded data together with the uncoded data are applied to a mapping unit supplying the data to be transmitted. The receiver comprises, on the output side of a demodulator, a branch metric calculation circuit receiving two streams of symbols usually called the I and Q streams. The branch metric calculation circuit is followed by a Viterbi decoder supplying coded sequences. The coded sequences are then applied to a demapping unit that reconstitutes the original data.

One feature of multidimensional trellis coding is that the receiver's Viterbi decoder clock has to be synchronized so that the decoder operates on entire code blocks, i.e. it knows which symbol is the first of a branch. If it takes the second or third symbol to start decoding a branch, then the demodulation fails and the output result is invalid. This synchronization is referred to as branch synchronization and is described, for example, in the article "A technique for multidimensional symbol and multiplexing frame synchronization in multidimensional trellis coded modems using non-standard baud" by M. D. Rauchwerk, Proc. ICC'88, IEEE, Philadelphia, pp.80–84, June 1988. In order to achieve branch synchronization as quickly as possible when a link is set up, the conventional method described in this article monitors the convergence of the path metrics in the Viterbi decoder.

FIG. 1 is a block diagram of a prior art branch synchronization device using the path metric convergence detection method.

This device is intended to be incorporated into a multidimensional trellis coded digital data receiver. The signal SR received by the receiver is applied to a demodulator 10 supplying two streams I and Q of digital symbols. These symbol streams are applied to time shift means 11 and 12 in the form of shift registers, the number of memory locations in which corresponds to the possible number of time shift hypotheses. For 3×8PSK trellis coded modulation there are three locations in each shift register, for example. The symbols are read into these registers on links 13 and 14 constituting the two inputs of a Viterbi decoder 15. The Viterbi decoder 15 includes a branch metric calculator 16 followed by a decoder circuit 17 supplying coded sequences $Z_0$, $Z_1$ and $Z_2$ at its outputs (in the case of a six-dimensional coder). These coded sequences are then fed to a demapping unit carrying out an operation that is the converse of that carried out by the mapping unit in the transmitter.

The Viterbi decoder 15 has an output supplying a path metric normalization indicator signal NMC. This signal is generated in the decoder circuit 17 using an algorithm for detecting divergence of the metrics supplied by the circuit 16. The signal NMC is fed to a counter 18 which counts the number of transitions of the signal NMC in a predetermined time T. The result of this counting is fed to a comparator 19 receiving a predetermined threshold value S. If the counting result is above the threshold value S, a time shift control signal SCT is generated by the comparator 19. The signal SCT is fed to the time shift means 11, 12 operating on the symbol streams fed to the Viterbi decoder 15. The symbol streams fed to the Viterbi decoder 15 are then shifted by one symbol interval. Accordingly, the metric divergence detection algorithm, the counter 18 and the comparator 19 constitute means for detecting branch synchronization.

The drawback of this synchronization device is that it takes a long time to achieve branch synchronization (it can take up to a few hundred symbol intervals). For QPSK convolutional coding subject to puncturing with a yield of ¾, for example, 800 symbols are required to decide if the sequence at the input of the Viterbi decoder 15 should be shifted or not.

In a multidimensional implementation, the convergence time is multiplied by the number of modulation symbols per branch of the trellis. For 3×8PSK trellis coded modulation, for example, each branch of the trellis used in the Viterbi decoder has three 8PSK symbols in series. Accordingly, the convergence time is multiplied by a factor of 3.

Finally, the symbols processed are those fed to the Viterbi decoder and these can be affected by transmission errors. This can lead to detection of metric divergence that is not due to non-synchronization of the branches but to interference affecting the received signal (selective fading generating intersymbol distortion, etc). Synchronization will then be corrected although it should not be.

An object of the present invention is to remedy these drawbacks.

To be more precise, one object of the invention is to provide a fast and reliable branch synchronization device for multidimensional trellis coded digital data receivers.

SUMMARY OF THE INVENTION

This object, and others that emerge hereinafter, are achieved by a branch synchronization device for multidimensional trellis coded digital data receivers using convolutional encoders, the device comprising a Viterbi decoder receiving two streams of symbols obtained from a received signal and supplying coded sequences and time shift means for time shifting the symbol streams, the time shift means being controlled by branch synchronization decision means generating a time shift control signal, wherein the branch synchronization decision means cooperate with a calculator circuit receiving the coded sequences and supplying to the synchronization decision means an output signal of a first type if the coded sequences correspond to sequences such as would be obtained directly from the convolutional encoder or supplying an output signal of a second type if the coded sequences do not correspond to sequences that could have been obtained from the convolutional encoder, the output signal being fed to the branch synchronization means to determine the time shift control signal.

Branch synchronization is therefore achieved much faster than in the prior art. The time taken is reduced by a factor in the order of 5.

The output signals of the first and second types can be digital signals, the output signal of the first type being a constant logic level (0 or 1) in the absence of interference (absence of noise and branch synchronization acquired), for example.

In a first embodiment, the branch synchronization decision means comprise a threshold device generating a time shift control signal if the number of transitions of the output signal in a given time reaches a threshold value. The data time and the threshold value can be predetermined or otherwise.

If the data time and the threshold value are not predetermined, the branch synchronization decision means advantageously further comprise a false alarm decision circuit to which the time shift control signal is fed, the false alarm detector circuit correcting the observation time and/or the threshold value if all the time shift hypotheses have been tested without branch synchronization being acquired. This produces a branch synchronization device that is self-adaptive to transmission conditions.

In a second embodiment, the branch synchronization decision means comprise a counter adapted to count transitions of the output signal during a predetermined time, the counter supplying for each time shift hypothesis the number of transitions observed to a control device which time shifts the symbol streams so that the symbol streams fed to the Viterbi decoder are those for which the number of transitions observed is the lowest. In this second embodiment, all the shift hypotheses are therefore tested in succession and that for which branch synchronization is acquired is retained.

The invention applies not only to linear convolutional encoders, in which case the calculation circuit can be a syndrome calculator, but also to non-linear convolutional encoders, in which case the calculation circuit is a combinational logic system derived from the structure of the non-linear convolutional encoder.

The invention also concerns a multidimensional trellis coded digital data receiver comprising a branch synchronization device as defined hereinabove.

Other features and advantages of the invention will emerge from a reading of the following description of a number of preferred embodiments given by way of purely illustrative and non-limiting example, and from the appended drawings.

BRIEF DESCRIPTION OF THE DRAWINGS

FIGS. 5 and 6 are block diagrams of two other embodiments of the branch synchronization device of the invention that are self-adaptive to transmission conditions.

DETAILED DESCRIPTION OF THE PREFERRED EMBODIMENTS

Figure 1:
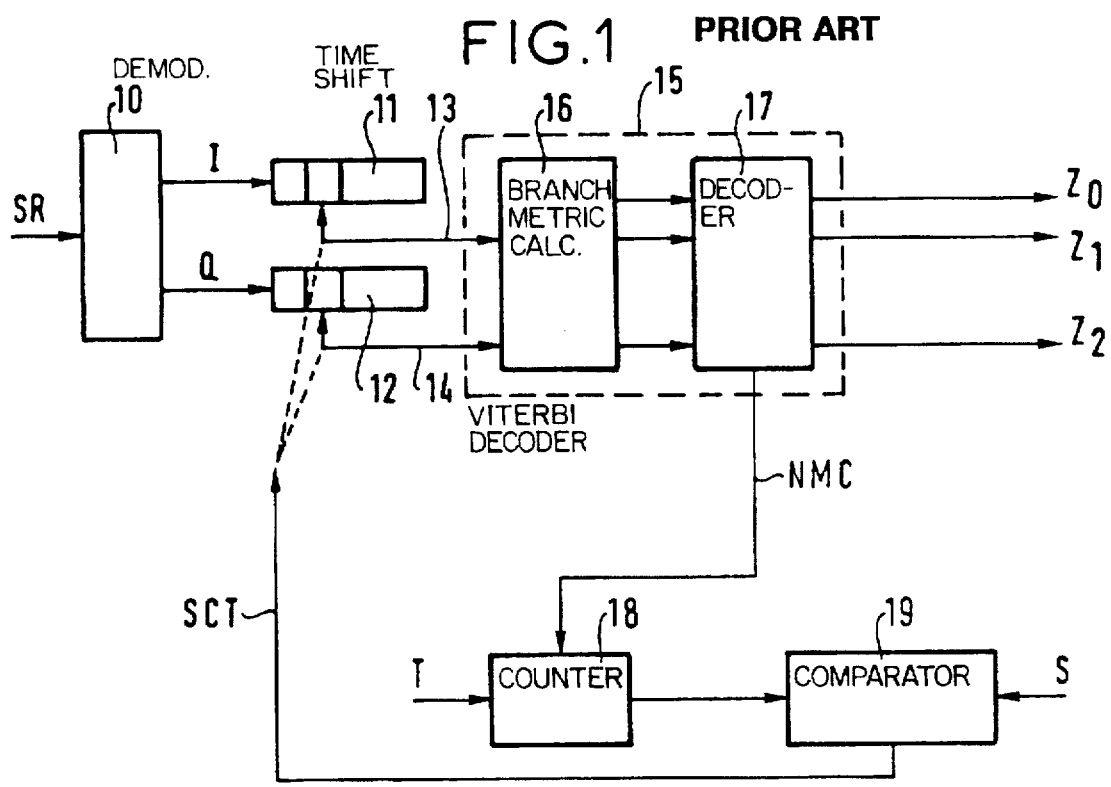
FIG. 1 is a block diagram of a prior art synchronization device using the path metric convergence detection method.

FIG. 1 has already been described in connection with the prior art.

Figure 2:
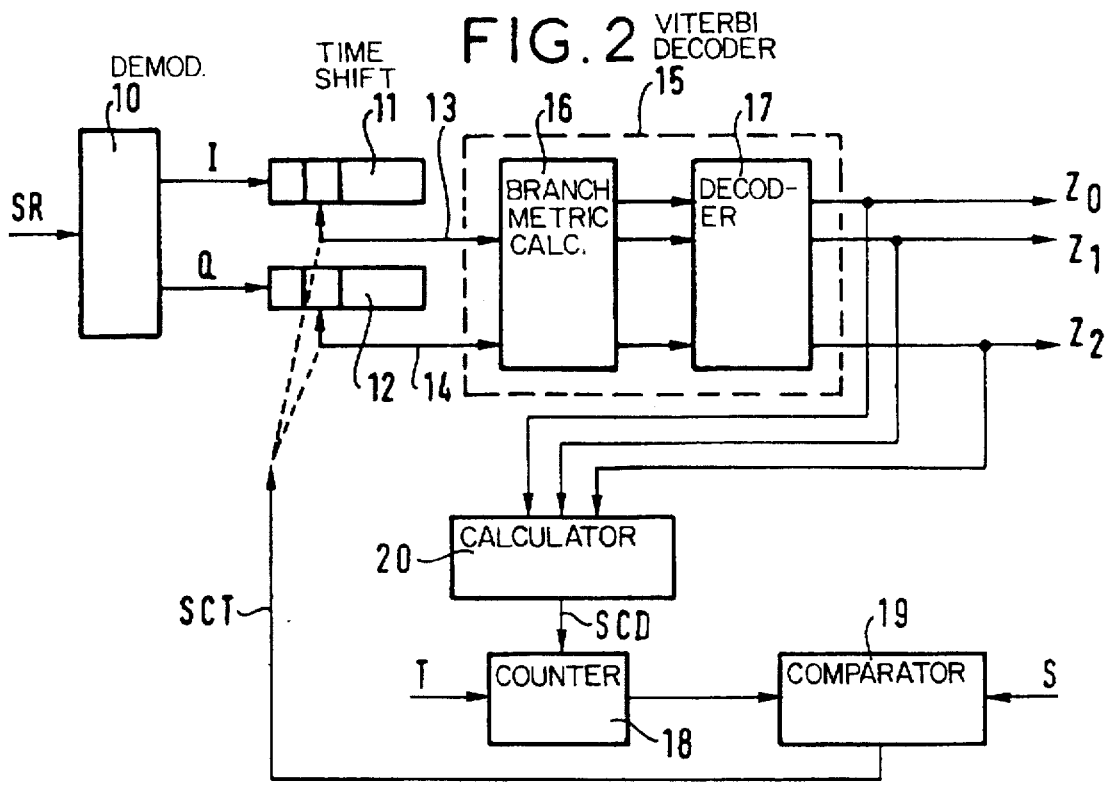
FIG. 2 is a block diagram of a first embodiment of the branch synchronization device of the invention.

FIG. 2 is a block diagram of a first embodiment of the branch synchronization device of the invention. Components identical to their counterparts in FIG. 1 carry the same reference symbols.

The branch synchronization device of the invention differs from that shown in FIG. 1 in that the coded sequences $Z_0$, $Z_1$ and $Z_2$ from the Viterbi decoder 15 are applied to a calculator circuit 20 the function of which is to supply an output signal SCD of a first type when branch synchronization is acquired or of a second type when branch synchronization is not acquired. For example, the signal SCD can be a constant logic level (for example logic 0) when branch synchronization is acquired and changing logic levels (alternating between logic 0 and logic 1) when branch synchronization is lost. Other alternatives are possible.

The signal SCD is applied to a threshold device comprising a counter 18 followed by a comparator 19 receiving a predetermined threshold value S. The counter 18 tells the comparator 19 the number of transitions of the signal SCD in a time T. If this number of transitions reaches the threshold value S, the comparator 19 points to a memory location of registers 11 and 12 adjacent the current location, which is equivalent to time shifting the streams of symbols I and Q applied to the Viterbi decoder 15 by one symbol interval.

If the number of transitions counted in time T does not reach the threshold value S, the counter 18 is reset to 0 and starts a new counting cycle. This amounts to regarding branch synchronization as having been acquired.

A number of transitions at the output of the calculator circuit 20 are detected in order to decide whether to shift the signals fed to the Viterbi decoder 15. Thus if each branch represents M symbols, at most M−1 time shifts are required to find the start of the branch.

Various implementations are possible. For example, the calculator circuit 20 can be configured so that it supplies a logic 0 when branch synchronization is acquired whereas its output signal alternates at random between logic 1 and logic 0 if synchronization is not acquired. In this case the counter 18 can simply count the number of logic 1 states in the signal SCD.

The structure of the calculator circuit 20 depends on that of the convolutional encoder used at the transmitter. Its design is based on the principle that as long as the Viterbi decoder 15 is supplying the expected sequences branch synchronization is correct. As a general rule, it is therefore designed to output a constant logic level if it were placed on the input side of the coder used in the transmitter. It can be therefore be regarded as cancelling the transmit coder. A transition at its output in the receiver therefore indicates either a transmission error due to the radio channel, which does not cause any time shift in the symbol streams if the threshold value S and the time T are correctly chosen, or that branch synchronization has not been acquired.

If the transmitter coder is a linear convolutional encoder, the circuit 20 can be a simple syndrome counter. Reference may be had to the article by G. D. FORNEY Jr entitled "Convolutional codes I: Algebraic structure", IEEE Trans. on Information Theory, vol. IT-16, pp.720–738, November 1970 on the design of syndrome calculators. On the other hand, if it is a non-linear coder, the syndrome concept does not apply. Nevertheless, it is also possible in this case to provide a calculator circuit supplying a constant logic level as long as the coded sequences correspond to expected sequences, ignoring transmission errors.

Generally speaking, this circuit can simply comprise a combinational logic system derived from the design of the convolutional encoder used in the transmitter.

Figure 3:
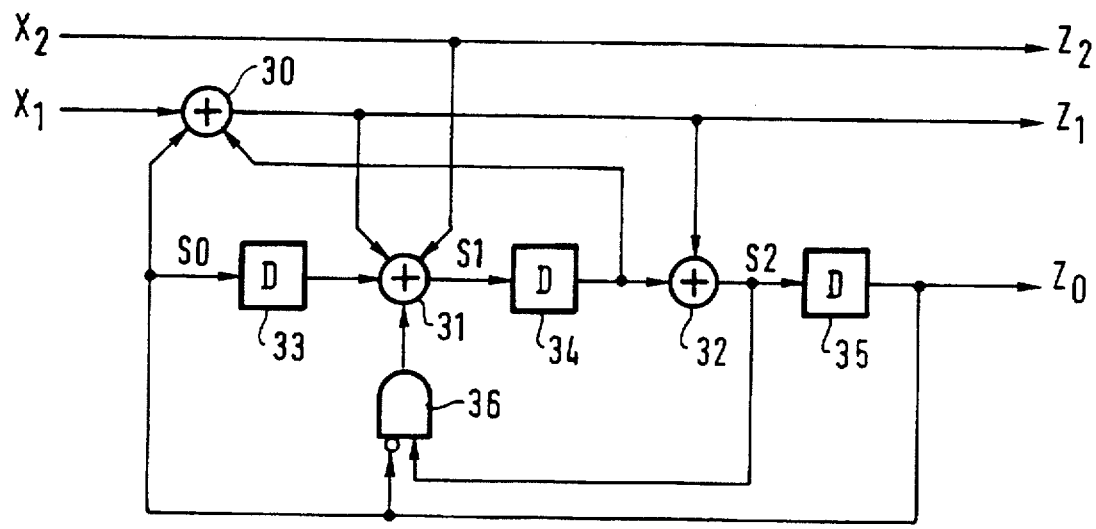
FIGS. 3 and 4 respectively show a non-linear convolutional encoder with eight phase states and the corresponding calculation device from FIG. 2.
Figure 4:
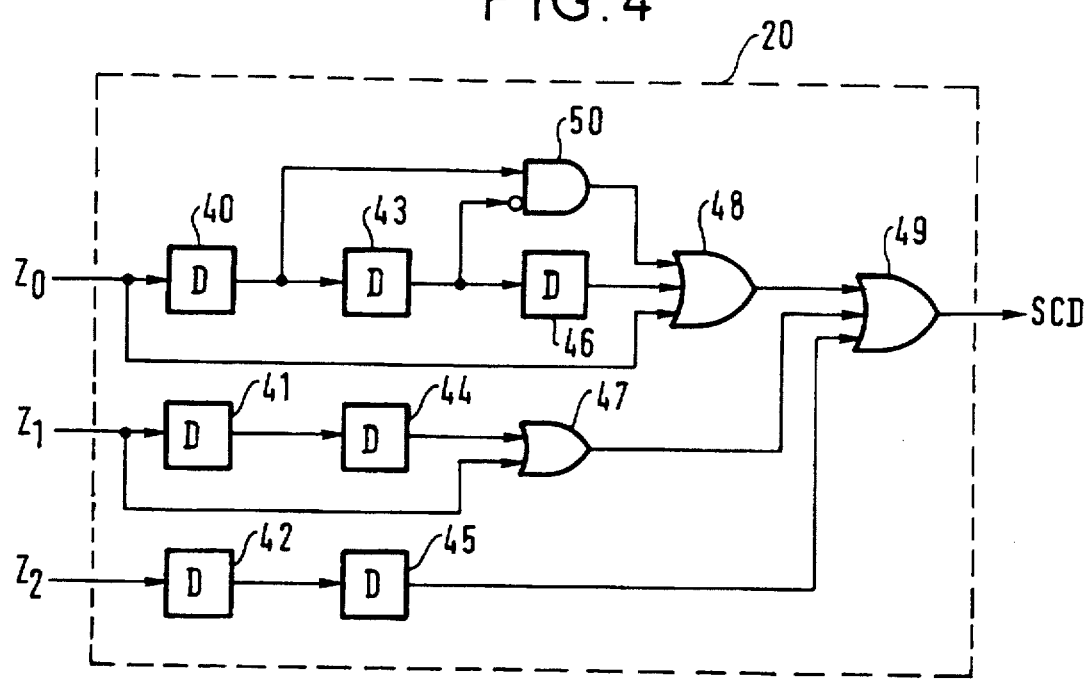

By way of example, FIGS. 3 and 4 respectively show a non-linear convolutional encoder with eight phase states and the corresponding calculator circuit 20 from FIG. 2.

The non-linear convolutional encoder in FIG. 3 complies with CCITT Recommendation V.32bis for transmission of QAM data via telephone channels. The coder input receives data $X_1$ and $X_2$ and its output supplies data $Z_2$, $Z_1$ and $Z_0$ (yield ⅔). Other data $X_3$ through $X_8$ (not shown) is applied to a mapping unit also receiving the data $Z_0$ through $Z_2$. The coder includes three summing devices 30 through 32 made up of OR gates, three flip-flops 33 through 35 each introducing a time-delay of one symbol interval D, and an AND gate 36 having one inverting input. The output equations of this convolutional encoder are:

$$Z_0(t)=S_2(t-1)$$

$$Z_1(t)=X_1(t) \oplus S_2(t-1) \oplus S_1(t-1)$$

$$Z_2(t)=X_2(t)$$

where the symbol $\oplus$ denotes the exclusive OR operator.
The state transition equations of this coder are:

$$S_0(t)=S_2(t-1)$$

$$S_1(t)=Z_1(t) \oplus X_2(t) \oplus S_0(t-1) \oplus \overline{[S_2(t-1)} \cdot (Z_1(t) \oplus S_1(t-1))]$$

$$S_2(t)=Z_1(t) \oplus S_1(t-1)$$

where $S_0$, $S_1$ and $S_2$ are respectively the inputs of the flip-flops 21, 22 and 23.
By combining these equations:

$$\begin{aligned} Z_0(t) &= Z_1(t-1) \oplus S_1(t-2) \\ &= Z_1(t-1) \oplus Z_1(t-2) \oplus X_2(t-2) \oplus S_0(t-3) \oplus \overline{[Z_0(t-2)} \cdot \\ &\quad (Z_1(t-2) \oplus S_1(t-3))] \\ &= Z_1(t-1) \oplus Z_1(t-2) \oplus Z_2(t-2) \oplus Z_0(t-3) \oplus \overline{[Z_0(t-2)} \cdot \\ &\quad Z_0(t-1)] \end{aligned}$$

The objective of the calculator circuit 20 is to cancel its output (SCD=0) for any sequence generated by the coder from FIG. 3. The following condition must therefore apply:

$$Z_0(t) \oplus Z_1(t-1) \oplus Z_1(t-2) \oplus Z_2(t-2) \oplus Z_0(t-3) \oplus \overline{[Z_0(t-2)} \cdot Z_0(t-1)]=0$$

This equation can be written as follows in the D (delay operator) domain:

$$[(1 \oplus D^3).Z_0(D)] \oplus [(D \oplus D^2).Z_1(D)] \oplus [D^2 Z_2(D)] \oplus [\overline{D^2 Z_0(D)} \cdot DZ_0(D)]=0$$

FIG. 4 is the block diagram of a circuit effecting this operation. It includes seven flip-flops 40 through 46, three OR gates 47 through 49 and an AND gate 50 with one inverting input. The output signal from the OR gate 49 constitutes the signal SCD fed to the counter 18 in FIG. 2. It is therefore possible to implement a "coder cancelling" circuit for a non-linear convolutional encoder.

The threshold value S and the counting period T condition the performance of the device of the invention, expressed in terms of probability of false alarms $p_{fa}$ and probability of non-detection $p_{nd}$. Both these probabilities are to be minimized. For example, considering the situation in which the signal SCD has the value 0 if branch synchronization is acquired, it is possible to determine two conditional probability laws for the number of logic 1 levels that provide two analytical formulas for calculating the following probabilities:

$$p(\#1=i/SA) \text{ and } p(\#1=j/NS)$$

where #1 means "number of 1 states", i and j are variables, SA means "synchronization acquired" and NS means "no synchronization".

These two probability densities are estimated by simulation or measurement. The following probabilities are then calculated:

$$p_{nd} = \sum_{j=0}^{j=S-1} p(\#1=j/NS) \text{ and } p_{fa} = \sum_{i=S}^{i=T-1} p(\#1=i/SA)$$

The time T must be as short as possible for fast branch synchronization acquisition, although the smaller the value of T the greater the false alarm probability $p_{fa}$. Similarly, the threshold value S will be made as low as possible to have a low probability of non-detection $p_{nd}$, although the lower the value of S the greater the false alarm probability $p_{fa}$. In practise it is recommended to set the required probabilities $p_{nd}$ and $p_{fa}$ beforehand to obtain the values of $p(\#1=j/NS)$ and $p(\#1=i/SA)$ by simulation or by measurement and then to calculate the threshold S and the time T by inverting the above equations. Here the time T and the threshold S are predetermined.

The time shift means 11 and 12 can be replaced by a clock selection system for synchronizing the Viterbi decoder clock to the incoming streams. There can be three clocks (in the case of 3×8PSK), for example, each shifted by one symbol interval relative to the other and fed to a multiplexer the output of which drives the Viterbi decoder. The clock selected is that for which branch synchronization is acquired.

The branch synchronization device described up to now presupposes that the propagation conditions are known in advance so that the probabilities $p_{nd}$ and $p_{fa}$ can be defined and the values of T and S defined accordingly. The propagation conditions are known with sufficient accuracy if the device of the invention is used for data transmission via a geostationary satellite, for example. On the other hand, if the transmission medium is non-stationary (presence of potential obstacles, noisy environment, etc), especially in the case of radio transmissions, it is beneficial if the device is self-adaptive to transmission conditions. To this end the branch synchronization device of the invention can be as shown in FIG. 5 or FIG. 6.

FIGS. 5 and 6 are block diagrams of two other embodiments of the branch synchronization device of the invention that provide self-adaptation to transmission conditions.

The FIG. 5 embodiment differs from that of FIG. 2 in that the branch synchronization decision means also comprise a false alarm detector circuit 50 to which the time shift control signal SCT is fed. The function of the circuit 50 is to correct the value of the count time T and/or the threshold value S if all the time shift hypotheses have been tested without acquiring branch synchronization. In the 3×8PSK case, for example, after two time shifts of the I and Q streams by one symbol interval, branch synchronization should have been acquired. If this is not so, there are false alarms due to transmission conditions. The circuit 50 then counts the number of time shifts applied, for example during a time 3T, and increases the count time T and/or the threshold value S if three successive time shifts are applied. The new values of T and S are respectively supplied to a counter 51 and to a comparator 52.

In another embodiment, shown in FIG. 6, the count time T of the counter 18 is predetermined and therefore can have any value (although it must be short to limit the branch synchronization acquisition time), and the branch synchronization decision means comprise a control device 60 which limits the I and Q symbol streams so that the symbol streams fed to the Viterbi decoder 15 are those for which the number of transitions observed is the lowest. The theory adopted here is that the time shift for which the number of transitions of the signal SCD is the lowest corresponds to that for which branch synchronization is acquired. When branch synchronization is acquired, the number of transitions of the signal SCD in a time T is very much lower than that when there is no branch synchronization. In the absence of branch synchronization, the signal SCD has around the same numbers of "1" levels and "0" levels, whereas the number of "0" levels is much greater when branch synchronization is acquired (this is in the case of the example shown in FIGS. 3 and 4).

The control device can operate sequentially: in the absence of branch synchronization, the number of transitions of the signal SCD during time T is memorized for each time shift hypothesis. Successive time shifts are then applied to the I and Q streams until all the hypotheses have been applied. The hypothesis for which the number of transitions is the lowest is then recognized as that constituting correct branch synchronization and the I and Q streams are time shifted accordingly.

The invention also concerns a multidimensional trellis coded digital data receiver comprising a branch synchronization device as described above.

The invention provides a time reduction by a factor of about 5 compared to the prior art solution and has the advantage of considering the coded sequences from the Viterbi decoder to decide whether branch synchronization has been acquired or not. These coded sequences have already undergone filtering in accordance with the maximum likelihood criterion.

There is claimed:

1. A branch synchronization device for a multidimensional trellis coded digital data receiver using a convolutional encoder, said device comprising:

a Viterbi decoder receiving two streams of symbols obtained from a received signal and supplying coded sequences;

a time shifter for time shifting said symbol streams;

a branch synchronization decision circuit generating a time shift control signal to control said time shifter; and a calculator circuit receiving as inputs only said coded sequences and supplying to said synchronization decision circuit an output signal of a first type if said coded sequences correspond to sequences such as would be obtained directly from said convolutional encoder and supplying an output signal of a second type if said coded sequences do not correspond to sequences that could have been obtained from said convolutional encoder, said output signal being fed to said branch synchronization decision circuit to determine said time shift control signal.

2. The device according to claim 1, wherein said output signals of said first and second type are digital signals.

3. The device according to claim 1, wherein, in the absence of interference, said output signal of said first type is a constant logic level.

4. The device according to claim 1, wherein said convolutional encoder is a linear device and said calculator circuit is a syndrome calculator.

5. Multidimensional trellis coded digital data receiver comprising a branch synchronization device according to claim 1.

6. A branch synchronization device for a multidimensional trellis coded digital data receiver using a convolutional encoder, said device comprising:

a Viterbi decoder receiving two streams of symbols obtained from a received signal and supplying coded sequences;

a time shifter for time shifting said symbol streams;

a branch synchronization decision circuit generating a time shift control signal to control said time shifter; and a calculator circuit receiving said coded sequences and supplying to said synchronization decision circuit an output signal of a first type if said coded sequences correspond to sequences such as would be obtained directly from said convolutional encoder and supplying an output signal of a second type if said coded sequences do not correspond to sequences that could have been obtained from said convolutional encoder, said output signal being fed to said branch synchronization decision circuit to determine said time shift control signal;

wherein said branch synchronization decision circuit comprises a threshold device generating a time shift control signal if the number of transitions of said output signal in a given time reaches a threshold value.

7. The device according to claim 6, wherein said given time and said threshold value are predetermined.

8. The device according to claim 6, wherein said branch synchronization decision circuit further comprises a false alarm detector circuit to which said time shift control signal is fed, said false alarm detector circuit correcting said observation time and/or said threshold value if all of the time shift hypotheses have been tested without branch synchronization being acquired.

9. A branch synchronization device for a multidimensional trellis coded digital data receiver using a convolutional encoder, said device comprising:

a Viterbi decoder receiving two streams of symbols obtained from a received signal and supplying coded sequences;

a time shifter for time shifting said symbol streams;

a branch synchronization decision circuit generating a time shift control signal to control said time shifter; and a calculator circuit receiving said coded sequences and supplying to said synchronization decision circuit an output signal of a first type if said coded sequences correspond to sequences such as would be obtained directly from said convolutional encoder and supplying an output signal of a second type if said coded sequences do not correspond to sequences that could have been obtained from said convolutional encoder, said output signal being fed to said branch synchronization decision circuit to determine said time shift control signal;

wherein said branch synchronization decision circuit comprises a counter adapted to count transitions of said output signal during a predetermined time, said counter supplying, for each time shift hypothesis, the number of transitions observed to a control device which time shifts said symbol streams so that said symbol streams fed to said Viterbi decoder are those for which said number of transitions observed is the lowest.

10. A branch synchronization device for a multidimensional trellis coded digital data receiver using a convolutional encoder, said device comprising:

a Viterbi decoder receiving two streams of symbols obtained from a received signal and supplying coded sequences;

a time shifter for time shifting said symbol streams;

a branch synchronization decision circuit generating a time shift control signal to control said time shifter; and a calculator circuit receiving said coded sequences and supplying to said synchronization decision circuit an output signal of a first type if said coded sequences correspond to sequences such as would be obtained directly from said convolutional encoder and supplying an output signal of a second type if said coded sequences do not correspond to sequences that could have been obtained from said convolutional encoder, said output signal being fed to said branch synchronization decision circuit to determine said time shift control signal;

wherein said convolutional encoder is a non-linear device and said calculator circuit is a combinational logic system derived from the design of said non-linear convolutional encoder.

* * * * *